(12) United States Patent
Apen et al.

(10) Patent No.: US 6,841,256 B2
(45) Date of Patent: Jan. 11, 2005

(54) LOW DIELECTRIC CONSTANT POLYORGANOSILICON MATERIALS GENERATED FROM POLYCARBOSILANES

(75) Inventors: Paul Apen, San Jose, CA (US); Hui-Jung Wu, Fremont, CA (US)

(73) Assignee: Honeywell International Inc., Morristown, NJ (US)

( * ) Notice: Subject to any disclaimer, the term of this patent is extended or adjusted under 35 U.S.C. 154(b) by 196 days.

(21) Appl. No.: 10/122,400

(22) Filed: Apr. 11, 2002

(65) Prior Publication Data

US 2003/0017635 A1 Jan. 23, 2003

Related U.S. Application Data

(60) Continuation-in-part of application No. 09/746,607, filed on Dec. 20, 2000, now Pat. No. 6,395,649, which is a division of application No. 09/327,356, filed on Jun. 7, 1999, now Pat. No. 6,225,238.

(51) Int. Cl.[7] .............................................. B32B 25/20
(52) U.S. Cl. ....................................... 428/447; 427/387
(58) Field of Search ........................... 428/447; 427/387

(56) References Cited

U.S. PATENT DOCUMENTS

| 5,357,019 A | 10/1994 | Weber et al. ................. 528/15 |
| 5,384,382 A | 1/1995 | Mori et al. .................... 528/15 |
| 5,483,017 A | 1/1996 | Keller et al. ..................... 528/5 |
| 5,602,060 A | 2/1997 | Kobayashi et al. ......... 437/238 |
| 5,789,325 A | 8/1998 | Chandra et al. ............ 438/781 |

FOREIGN PATENT DOCUMENTS

| EP | 0506432 | 9/1992 |
| FR | 2693465 | 7/1992 |

OTHER PUBLICATIONS

Shu Seki, et al. entitled, "Positive–Negative Inversion of Silicon Based Resist Materials: Poly (di–n–hexylsilane) for Ion Beam Irradiation" dated Aug. 8, 1997 pp. 5361–5364.

*Primary Examiner*—Kuo-Liang Peng
(74) *Attorney, Agent, or Firm*—Bingham McCutchen; Sandra P. Thompson

(57) ABSTRACT

Methods are presented herein for forming thermally stable, adhesive, low dielectric constant polyorganosilicon dielectric films for use as semiconductor insulators and as adhesion promoters as and in conjunction with low k materials. Surprisingly, the methods described herein can provide polyorganosilicon materials, coatings and films having very low dielectric constants that are generated from specified polycarbosilane starting materials employing wet coating and standard high energy generating processes, without the need for exotic production techniques or incurring disadvantages found in other low k dielectric film-forming methods. The polycarbosilane compounds, polyorganosilane compounds, adhesion promoter materials and layered materials disclosed herein can be used in any suitable semiconductor or electronic application, including semiconductor devices, electronic devices, films and coatings.

18 Claims, 5 Drawing Sheets

LOW DIELECTRIC CONSTANT POLYORGANOSILICON MATERIALS GENERATED FROM POLYCARBOSILANES

This application is a continuation-in-part of Ser. No. 09/746,607 filed on Dec. 20, 2000 issued U.S. Pat. No. 6,395,649 issued on May 28, 2002, which is a divisional of Ser. No. b09/327,356 issued on Jun. 7, 1999 issued U.S. Pat. No. 6,225,238 issued on May 1, 2001.

FIELD OF THE INVENTION

The present invention relates generally to polycarbosilane-generated compositions, methods of manufacture and uses thereof, and more specifically to polyorganosilicon compositions that form low dielectric constant, low moisture absorbing and high glass transition temperature dielectric films, adhesion promoters, dielectric materials, adhesion promoter materials and coatings for microelectronic devices, semiconductor devices, electronic devices, related layered materials and methods of manufacture thereof.

BACKGROUND OF THE RELATED ART

Semiconductor integrated circuit designs have been generally produced by applying fine patterns of semiconductor regions, electrodes, wiring and other components onto the semiconductor substrate by using conventional process steps, such as chemical vapor deposition (CVD). After the wire pattern is laid down on the device, a multi-layer semiconductor component can be formed through the application of dielectric materials and/or other suitable layers of materials.

Generally, advances in the semiconductor industry are characterized by the introduction of new generations of integrated circuits (ICs) having higher performance and greater functionality than that of previous generations for the purpose of obtaining rapid processing of large amounts of data and information. These advances are often the result of reducing the size of the IC devices; that is, the advances in the integration do not rely upon the expansion of the size or dimension of the device, i.e., the chip, but can be obtained by miniaturizing and increasing the number of components fabricated in the chip and accordingly reducing the dimensions of the chips themselves. As a result, the minimum size of line and space of the wiring in the chips is on the order of submicrons and as a necessity, the wiring structure adopted in current chips is a multi-layer or multi-level wiring or metallization structure.

However, as device geometries in semiconductor wafers approach and then go beyond dimensions as small as 0.25 microns ($\mu$m), the dielectric constant of insulating material used between conductive paths, for example silicon oxide ($SiO_2$), becomes an increasingly significant factor in device performance. As the distance between adjacent conductive paths become smaller, the resulting capacitance, a function of the dielectric property of the insulating material divided by the distance between conductive paths, increases. The increase in capacitance causes increased capacitive coupling, or cross-talk, between adjacent conductive paths which carry signals across the chip. The increased capacitance further results in increased power consumption for the IC and an increased RC time constant, the latter resulting in reduced signal propagation speed. In sum, the effects of miniaturization cause increased power consumption, limit achievable signal speed, and degrade noise margins used to insure proper IC device or chip operation.

One way to diminish power consumption and cross talk effects is to decrease the dielectric constant of the insulator, or dielectric, which separates the conductors. Probably the most common semiconductor dielectric is silicon dioxide, which has a dielectric constant (k) of about 3.9. In contrast, air (including partial vacuum) has a dielectric constant of just over 1. Still other insulating materials can provide films having low dielectric constants in the range of approximately 2.0 to 3.0, significantly lower than that of the silicon dioxide films. Therefore, it is well-known that reduced capacitance in the use of certain organic or inorganic insulating materials can result in the alleviation of the aforementioned problems of capacitive coupling and the like. However, any material contemplated for use in semiconductor devices must meet other criteria in addition to a low dielectric constant before it can be used to replace the commonly employed silicon dioxide. For example, any coating material contemplated for use as a dielectric or in conjunction with a dielectric in a semiconductor device should demonstrate the following qualities or characteristics:

1. Excellent Electrical Insulating Properties;
2. High Thermal Stability;
3. Crack Resistance; and
4. Good Adhesion to Underlying Surfaces and/or Coated Surfaces.

Many dielectric materials and related materials have been proposed for use as dielectric film coatings in semiconductor devices, but most of them are considered to be unsatisfactory in meeting the above-mentioned stringent electrical and physical requirements. The dielectric film-forming materials include inorganic materials which are applied over a patterned wiring layered structure by chemical vapor deposition (CVD) processes. Typical examples of useful inorganic dielectric materials include silicon dioxide ($SiO_2$), silicon nitride ($Si_3N_4$) and phosphosilicate glass (PSG). The preferred formation of these inorganic dielectrics by CVD processes leaves these inorganic dielectric layers inherently defective because plasma based deposition processes reproduce the uneven and stepped profile structure of the underlying wiring pattern. On the other hand, several organic and organic/inorganic dielectric materials such as polyimide resins, organic SOG (Spin-On-Glass), and other similar dielectric materials have generally been unsatisfactory in one or more of the above-mentioned desired electrical or physical properties of a dielectric coating and/or related materials/coatings. For example, several polyimide resins demonstrate high moisture absorption due to their polarizing chemical structures. Moisture absorption, in turn, causes an undesirable increase in the dielectric constant of the particular polyimide material being used.

Therefore, there is still a need to design and produce low dielectric coating materials that can be used as a replacement for silicon dioxide while having the following properties: a) acts as an excellent electrical insulator in comparison with conventional materials and films/coatings; b) has increased thermal stability over conventional materials and films/coatings; c) is more resistant to cracks and wear than conventional materials and films/coatings; and d) has good adhesion to underlying and/or surrounding surfaces and/or coating surfaces and other adjacent layers, as compared to conventional materials and films.

SUMMARY OF THE INVENTION

Methods are presented herein for forming thermally stable, adhesive, low dielectric constant ("k" less than 4.0, preferably less than 3.0, and most preferably less than 2.5) polyorganosilicon dielectric films for use as semiconductor insulators and as adhesion promoters as and in conjunction with low k materials. Surprisingly, the methods described herein can provide polyorganosilicon materials, coatings and films having very low dielectric constants that are generated from specified polycarbosilane starting materials employing wet coating and standard high energy generating processes, without the need for exotic production techniques or incurring disadvantages found in other low k dielectric film-forming methods.

In accordance with the present invention, there are provided methods for the preparation of a low dielectric constant polyorganosilicon coatings, materials and films that can be used alone as a low k dielectric material or in conjunction with another dielectric material as an adhesion promoter, adhesion promoter material or adhesion promoter precursor material by applying to a suitable surface a composition comprising a polycarbosilane compound of the general formula:

FORMULA I

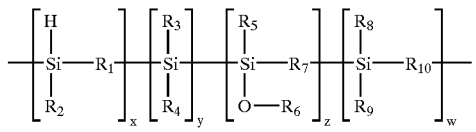

in which:

R$_1$, R$_7$, and R$_{10}$ each independently represents a substituted or unsubstituted alkylene, cycloalkylene, or arylene group;

R$_2$, R$_3$, R$_4$, R$_5$, R$_8$ and R$_9$ each independently represents a hydrogen atom or a first organic group, wherein the first organic group comprises alkyl, alkenyl, alkynyl, alkylene, vinyl, cycloalkyl, allyl or aryl and may be linear or branched and may be substituted or unsubstituted; and R$_6$ represents an organosilicon, a silanyl, a siloxyl, or a second organic group; and x, y, z and w satisfying the conditions of [4<x+y+z+w<100,000], and y and z and w can collectively or independently be zero.

The first and second organic groups, or any other organic groups contemplated herein, may contain up to 18 carbon atoms but generally contain from about 1 to about 10 carbon atoms. Particularly useful alkyl groups include —CH$_2$— and —(CH$_2$)$_e$— where e>1.

A surface is then coated with the polycarbosilane compound of Formula I to produce a polycarbosilane-coated surface. The surface may comprise a substrate, a dielectric material, or any other suitable material or layered material that can be used in an electronic or semiconductor application.

The polycarbosilane-coated surface is then subjected to an energy source to chemically react the polycarbosilane compound and to subsequently crosslink the polycarbosilane compound to form adhesion promoter materials that comprises a polyorganosilicon material, wherein the adhesion promoter material has a dielectric constant of less than about 4.0.

In a preferred embodiment, the polycarbosilane (Formula I) coated surface is subjected to an energy source by heating it in multistage steps (step-wise) at sequentially elevated temperatures of from 50° C. to about 450° C. under controlled conditions and environments to convert the polycarbosilane to a thermally stable polyorganosilicon coating having a low dielectric constant of less than about 4.0.

A preferred method, as disclosed herein, is directed to baking the polycarbosilane of Formula I in multistage steps at sequentially elevated temperature plateaus of from about 50° C. to about 450° C. in a controlled manner and environment; and further heating and curing the pretreated polycarbosilane at temperatures exceeding about 400° C. to form an organosilicon polymer film having electrically insulating properties characterized by a dielectric constant of less than about 4.0. More precisely, the polycarbosilane compound of Formula I is subjected to a) multiple heating (baking) steps at sequentially increasing temperatures of not more than about 100° C. and 200° C., respectively, under atmospheric or non-oxidizing (e.g.; inert or non-reacting gases such as nitrogen or argon gas) environmental conditions for periods sufficient to chemically react and subsequently crosslink the polycarbosilane; b) further baking of the polycarbosilane material at temperatures of from about 200° C. to 400° C. to effect further crosslinking; and thereafter c) heat curing the crosslinked polycarbosilane under non-oxidizing environments (e.g. inert or non reacting gas environments such as nitrogen, argon etc.) at temperatures of up to about 450° C. to achieved densification of the final organosilicon coating, film or material to form a film characterized by a low dielectric constant, such as less than about 4.0, more preferably less than 3.0 and most preferably less than about 2.5.

By selecting the polycarbosilane compounds of Formula I and subjecting them to the particular thermal (heating) conditions herein, a crosslinked organosilicon polymer is produced which possesses a dielectric constants of less than about 4.0. The selection of the particular polycarbosilanes of Formula I and the subjection of these materials to a multistep or step-wise temperature method enable a controlled crosslinking (and optionally oxidation) of the polycarbosilane starting (precursor) materials to form the present polycarbosilane-generated organosilicon polymers, while avoiding the complete ceramification or oxidation of these polyorganosilicon materials. The methods described herein generate a low dielectric constant polyorganosilicon coating, material or film that is thermally stable under hostile high temperature environments encountered in semiconductor processing and further demonstrates good adhesion to adjacent layers and surfaces upon which the material is coated, including dielectric layers, dielectric materials and other layered materials, such as antireflective coating layers, metal layers, porous layers, and etchstop layers.

The polycarbosilane precursor compositions represented by Formula I react under the high energy source conditions of the methods described herein to generate low dielectric constant polyorganosilicon films (k value less than about 4.0) suitable for use as dielectric interlayers or interliners, adhesion promoters or other suitable layers in semiconductor integrated circuits, electronic components and other layered materials that can be utilized in semiconductor and electronic applications. Crucial to the materials discovered herein are the findings that the polycarbosilanes of Formula 1 have (1) a reactive hydrido-substituted silicon and (2) stable alkylene, cycloalkylene, or arylene substituents (R$_1$, R$_7$, and R$_{10}$) in the backbone structure of the polycarbosilane, which render the polycarbosilane polymer disclosed herein both reactive and durable when subjected to multiple-stage heating and curing as described herein.

In another embodiment, a layered material is produced that comprises: a) the adhesion promoter materials produced by methods described herein; b) a dielectric material having a dielectric constant less than about 4.0, wherein the dielectric material is coupled to the adhesion promoter material;

and c) a third layer of material coupled to the adhesion promoter material. At least one additional layer can optionally be added to the layered material.

The polycarbosilane compounds, polyorganosilane compounds, adhesion promoter materials and layered materials disclosed herein can be used in any suitable semiconductor or electronic application, including semiconductor devices, electronic devices, films and coatings.

DETAILED DESCRIPTION OF THE PREFERRED EMBODIMENTS

Figure 1:
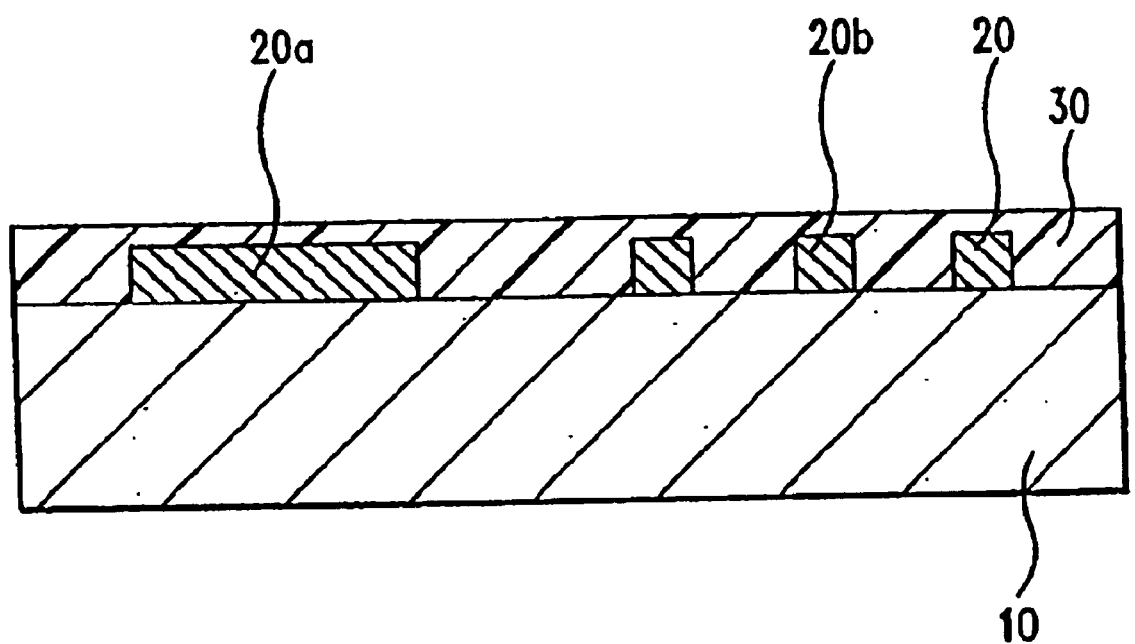
FIG. 1 is a cross-sectional view of a semiconductor device according to the present invention having a planarized dielectric film layer coating for a metallized structure.

In response to the need for low dielectric coating materials which can be used as a replacement for silicon dioxide, it has been discovered that certain polycarbosilanes and polycarbosilane compounds can be subjected to controlled thermal processing to avoid ceramification (oxidation to $SiO_2$) and form organosilicon polymers having excellent dielectric properties (low k or low capacitance dielectrics), and that are readily useful as film forming materials in the manufacture of semiconductor devices, semiconductor components, electronic components and layered materials. The polyorganosilicon materials disclosed herein are characterized by a dielectric constant of at least as low as about 4.0 and in some instances, as low as 2.5, which is well below that of silicon dioxide. These polyorganosilicon materials are also capable of forming globally planarized, thermally stable and adherent dielectric layers and other dielectric-like layers or materials on semiconductor devices, semiconductor components, electronic components and layered materials—all heretofore unappreciated by conventional methods and processes.

For example, in U.S. Pat. No. 5,602,060 issued to Kobayashi, a process is disclosed for preparing semiconductor wafers by applying an organic solvent solution of a particular polycarbosilane onto a wire patterned semiconductor wafer and curing the resulting film layer of the polycarbosilane at temperatures equal to or greater than 350° C. in an oxidizing atmosphere to convert (ceramify) the entire film into a silicon oxide layer. While this patented process has certain advantages in achieving a totally planarized film surface from an organic polycarbosilane precursor, the ultimate silicon dioxide insulating material has an inadequate dielectric constant to meet the above-described new geometries and wiring architecture.

In U.S. Pat. No. 5,789,325, issued to Shandra et al. (Shandra)., a polycarbosilane material is dissolved in an organic solvent, spin coated onto an electronically patterned device, and the resulting coating heated in an oxidizing environment for a time sufficient (up to six hours) at high temperatures to ceramify and thereby form a silicon dioxide-containing hardened coating on the electronic device. The very purpose of Shandra is the heating of the polycarbosilane coating in an oxidizing environment to attain complete conversion (ceramification) to a to a silica containing coating. The Shandra process is, like that of Kobayashi, inadequate in achieving k values below 3.0 because the nature of the ultimately formed silicon base coating would inherently have a dielectric constant approximating that of silicon dioxide (3.9).

It has been discovered that certain polycarbosilanes can be subjected to energy generating controlled processes under controlled conditions to generate certain organosilicon films and materials having low dielectric constants (below about 4.0 and at least below that of silicon dioxide) and sufficient glass transition temperature values (Tg) above 350° C. so as to form heat resistant semiconductor film coatings, which can withstand the hostile environments of semiconductor plasma processing. The polyorganosilicon coating-generating methods can utilize any energy source, including extended and point sources. Preferred sources are thermal (heat) and/or high energy sources, such as thermal (heat), electron-beam (e-beam), UV (ultraviolet) light, and any other functional high energy source. Contemplated point sources include lasers. These energy sources are applied to the polycarbosilanes compounds contemplated herein in a controlled manner to convert the polycarbosilanes to polyorganosilicon materials, which unexpectedly form low k dielectric coatings, materials or films. A preferred high energy processing is the application of thermal (heat) energy to the instant polycarbosilanes in discreet incremental steps of increasing temperature to form the instant low k polyorganosilicon coatings.

Low k polyorganosilicon dielectric and adhesive materials, films and coatings contemplated herein have good adhesion to a variety of common semiconductor surfaces, electronic surfaces and other layered materials without the use of adhesive agents. Moreover, the instant polyorganosilicon dielectric materials possess significant gap filling characteristics, thereby providing complete fill between conductive spaces of 0.25 microns ($\mu$m) or less. These low k polyorganosilicon dielectric materials also possess sufficient thermal stability so as not to evidence any outgassing during ongoing semiconductor processing, low moisture absorption to retain film resistivity, and stability to a variety of common etching processes. As in the case of applying an organic photoresist film coating to a semiconductor wafer, the present low k polycarbosilane generated dielectric coatings can be easily applied in high yield to electronic substrates using standard spin-bake-cure processing techniques, thereby insuring the cost effectiveness of the polycarbosilane precursor materials. Finally, the polycarbosilane-generated dielectric materials and coatings developed and disclosed herein are applicable for use in other microelectronic devices in addition to ICs, for example, printed circuit boards (PCBs), multi-chip modules (MCMs) and the like.

The methods disclosed herein were developed based on the findings that conventional polycarbosilane coating materials are not generally suitable for accomplishing low k dielectric constant values needed for coating the presently miniaturized patterned wiring of semiconductor wafers. It has been found that the generally accepted and uncontrolled heating methods used to bake and cure such topographical coatings cause crosslinking and chemical reactions that disturb the organosilicon nature of the particular polycarbosilane, with the result that the organosilicon polymer is cleaved and oxidized to a point of forming a preponderance of oxygenated silicon throughout the material, thereby eliminating the beneficial features of an organosilicon coating, such as a low dielectric constant. Put another way, the ceramified organosilicon films generated in conventional processes have resistivities approximating silicon dioxide and are inflexibly solid, resulting in brittleness and other properties unsuitable in a low dielectric constant film coatings needed in present semiconductor patterning techniques. By contrast, it has been found that the polycarbosilanes compounds and materials provided herein form polymeric materials which have the requisite electrical properties for semiconductor and electronics insulation use and applications, and also have the physical properties of thermal stability under severe processing conditions and high adhesivity to substrate surfaces and other layer surfaces used in the electronics industry.

Generally, low dielectric constant polyorganosilicon coatings, materials and films that can be used alone as a low k dielectric material or in conjunction with another dielectric material as an adhesion promoter, adhesion promoter material or adhesion promoter precursor material can be prepared by applying to a suitable surface a composition comprising a polycarbosilane compound of the general formula:

FORMULA I

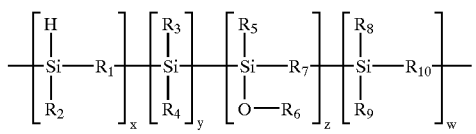

in which:

R$_1$, R$_7$, and R$_{10}$ each independently represents a substituted or unsubstituted alkylene, cycloalkylene, or arylene group;

R$_2$, R$_3$, R$_4$, R$_5$, R$_8$ and R$_9$ each independently represents a hydrogen atom or a first organic group, wherein the first organic group comprises alkyl, alkenyl, alkynyl, alkylene, vinyl, cycloalkyl, allyl or aryl and may be linear or branched and may be substituted or unsubstituted; and R$_6$ represents an organosilicon, a silanyl, a siloxyl, or a second organic group; and x, y, z and w satisfying the conditions of [4<x+y+z+w<100,000], and y and z and w can collectively or independently be zero.

The first and second organic groups, or any other organic groups contemplated herein, may contain up to 18 carbon atoms but generally contain from about 1 to about 10 carbon atoms. Particularly useful alkyl groups include —CH$_2$— and —(CH$_2$)$_e$— where e>1.

The polycarbosilane-coated surface may comprise a substrate, a dielectric material, or any other suitable material or layered material that can be used in an electronic or semiconductor application.

The polycarbosilane-coated surface is then subjected to an energy source to chemically react the polycarbosilane compound and to subsequently crosslink the polycarbosilane compound to form adhesion promoter materials that comprises a polyorganosilicon material, wherein the adhesion promoter material has a dielectric constant of less than about 4.0.

In a preferred embodiment, the method disclosed herein of preparing adhesion promoter materials is carried out by first providing the polycarbosilane compound of Formula I, coating a surface with the polycarbosilane compound to produce a polycarbosilane-coated surface; and then subjecting the polycarbosilane to an energy source, and in other preferred embodiments to a multistage heating process, to convert the polycarbosilane to an adhesion promoter material that comprises a polyorganosilicon material having a dielectric constant of less than about 4.0. The multistage heating processes described herein are sequential heating steps at substantially isothermal plateaus under controlled environmental conditions to achieve conversion of the polycarbosilane to an adhesion promoter material that comprises a polyorganosilicon material having the beneficial electrically insulating characteristic of a dielectric constant (k) of less than 4.0. The multistage heating steps are carried out at sequentially increasing temperatures (also referred to as "step-wise") of from 50° C. to 450° C. to convert the polycarbosilane of Formula I into a low k polyorganosilicon material that can act as a dielectric material, as an adhesion promoter, and as an adhesion promoter material or precursor. The sequential multistage heating steps herein operate at substantially isothermal temperature step plateaus of less than 100° C., 200° C., 400° C. and 450° C. The contemplated method can be carried out under a totally open (or oxidizing) atmospheric environment in which case the polycarbosilane compound is oxidized in the crosslinking conversion to the low k adhesion promoter that comprises a polyorganosilicon composition. Alternatively, the multistage heating process can be entirely carried out in an inert (or non-reactive) environment such as under a nitrogen or argon gas blanket to prevent oxidation of the polycarbosilane-generated organosilicon material, if so desired. The final heating step is a curing step at temperatures above 400° C. and is generally conducted in a non-oxidizing environment to harden the adhesion promoter material/coating that comprises a polyorganosilicon material. This multistage process or any part hereof can be carried out under any environment such as inert gas, air atmosphere, unreactive gas, oxygenating gas, or mixtures thereof without departing from the spirit or scope of the invention.

In Formula I, the substituents R$_1$ R$_7$, and R$_{10}$ independently represent a substituted or unsubstituted alkylene, cycloalkylene or an arylene group. The arylene group may be any divalent aromatic hydrocarbon such as phenylenes and naphthenes. The R$_1$ alkylene, cycloalkylene, or arylene groups insure the thermal stability of the polycarbosilane starting materials during the intense energy applications, particularly the multistage (step-wise) heating process.

R$_2$, R$_3$, R$_4$, R$_5$, R$_6$, R$_8$ and R$_9$ each independently represents a hydrogen atom or a first or second organic group in the form of a substituted or unsubstituted alkyl, alkenyl, alkynyl, or aryl group. The alkyl, alkenyl, and alkynyl groups may contain up to 18 carbon atoms, but generally contain from about 1 to 10 carbon atoms. Particularly useful alkyl groups include —CH$_2$— and —(CH$_2$)$_e$— where e>1. Preferred polycarbosilanes of the present invention include dihydrido polycarbosilanes in which the R$_2$ group is a hydrogen atom and appendant radicals are non-existent—that is y, z and w are all zero. Another preferred group of polycarbosilanes are those in which the R$_2$, R$_3$, R$_4$, R$_5$, R$_8$, and R$_9$ groups of Formula I are substituted or unsubstituted alkenyl groups having from 2 to 8 carbon atoms. The alkenyl group may be ethenyl, propenyl, allyl, butenyl or any other unsaturated organic backbone radical having up to 10 carbon atoms. The alkenyl group may be dienyl in nature and includes unsaturated alkenyl radicals appended or substituted on an otherwise alkyl or unsaturated organic polymer backbone. Examples of these preferred polycarbosilanes include dihydrido or alkenyl substituted polycarbosilanes, such as polydihydridocarbosilane, polyallylhydridocarbosilane and random copolymers or blockpolymers of polydihydridocarbosilane and polyallylhydridocarbosilane.

As can be observed in Formula I, the polycarbosilane compounds utilized in the present process may contain oxidized radicals in the form of siloxyl groups when $z>0$. Accordingly, $R_6$ represents an organosilicon, a silanyl, a siloxyl, or an organo group when $z>0$. It is to be appreciated that the oxidized versions of the polycarbosilanes of Formula I ($z>0$) operate very effectively in, and are well within the purview of, the multistep heating process of the present invention. As is equally apparent, z can be zero independently of x and y, the only conditions being that the radicals x, y, and z of the Formula I polycarbosilane compounds must satisfy the conditions of [$4<x+y+z+w<100,000$], and y and z can collectively or independently be zero.

In the more preferred polycarbosilanes, the $R_2$ group of Formula I is a hydrogen atom and $R_1$ is methylene and the appendant radicals y, z and w are zero. Other preferred polycarbosilane compounds are polycarbosilanes of Formula I where $R_2$ and $R_8$ are hydrogen, $R_1$ and $R_{10}$ are methylene, and $R_9$ is an alkenyl, and appendant radicals y and z are zero. In the most preferred polycarbosilanes, the $R_2$ group of Formula I is a hydrogen atom, $R_1$ is —$CH_2$—; y, z and w are zero and x is from 5–25. These most preferred polycarbosilanes may be obtained from any suitable source, such as Starfire Systems, Inc. Specific examples of these most preferred polycarbosilanes are shown below:

| Polycarbosilane | Weight Average Molecular Weight (Mw) | Polydispersity | Peak Molecular Weight (Mp) |
|---|---|---|---|
| 1 | 400–1400 | 2.0–2.5 | 330–500 |
| 2 | 330 | 1.14 | 320 |
| 3 (with 10% allyl groups) | 10,000–14,000 | 10.4–16.0 | 1160 |
| 4 (with 75% allyl groups) | 2400 | 3.7 | 410 |

"Silanes" as my be used herein are compounds which contain one or more silicon-silicon bonds. The term "silanyl" refers to the silane radical as it may occur in the polycarbosilanes or the polycarbosilane-generated derivatives (polyorganosilicon compounds) of the methods and applications disclosed herein. The term "polysilane" is intended to include oligomeric and polymeric silanes; i.e., compounds which include two or more monomeric silane units.

"Siloxanes" as used herein refer to compounds which contain one or more silicon-oxygen bonds and may or may not contain cyclic units. The term "siloxyl" refers to a siloxane radical as it may occur in the polycarbosilanes or the polycarbosilane-generated derivatives (polyorganosilicon compounds) of the methods and applications described herein. The terms "polysiloxane" and "siloxane polymer" as may be used herein are intended to include oligomeric and polymeric siloxanes, i.e., compounds which include two or more monomeric siloxane units.

The term "organic" or "organo" refers to a branched, straight-chain, or cyclic hydrocarbon group or radical of 1 to 26 carbon atoms, typically of 1 to 10 carbon atoms. "Organic" or "Organo" groups include, among others, alkyl, alkenyl, alkylene, and aryl groups.

The polycarbosilane compounds used herein can be produced from starting materials which are presently commercially available from many manufacturers. They may be produced by using conventional polymerizable processes. For example, the starting materials can be produced from common organosilane compounds or from polysilane as a starting material by a) heating an admixture of polysilane with polyborosiloxane in an inert atmosphere to thereby produce the corresponding polymer or b) by heating an admixture of polysilane with a low molecular weight carbosilane in an inert atmosphere to thereby produce the corresponding polymer or c) by heating an admixture of polysilane with a low molecular carbosilane in an inert atmosphere and in the presence of a catalyst such as polyborodiphenylsiloxane to thereby produce the corresponding polymer. Polycarbosilanes can also be synthesized by Grignard Reaction reported in U.S. Pat. No. 5,153,295 hereby incorporated by reference in its entirety. Note that polycarbosilanes are well known as being useful as raw materials in the production of silicone carbide fibers as well as film coatings for electrical devices.

The polycarbosilane compounds having a structure shown in Formula I are mixed with a suitable solvent and used to coat a suitable surface to form a polycarbosilane-coated surface. In a preferred embodiment, a solvent solution of the polycarbosilane of Formula I is applied onto a substrate. A wide variety of organic solvents can be used as long as they are able to dissolve the polycarbosilane compound and at the same time effectively control the viscosity of the resulting polymeric solution as a coating solution. Various facilitating measures such as stirring and/or heating may be used to aid in the dissolution. Suitable solvents include organic solvents such as methylisobutylketone (MIBK), dibutyl ether, xylene, benzene, toluene, n-heptane, hexane, cyclohexane, octane, decane, or cyclic dimethylpolysiloxanes and the like.

Surfaces, substrates and substrate layers contemplated herein may comprise any desirable substantially solid material. Particularly desirable surfaces or substrates would comprise films, glass, ceramic, plastic, metal or coated metal, or composite material. In preferred embodiments, the surface or substrate comprises a silicon or germanium arsenide die or wafer surface, a packaging surface such as found in a copper, silver, nickel or gold plated leadframe, a copper surface such as found in a circuit board or package interconnect trace, a via-wall or stiffener interface ("copper" includes considerations of bare copper and it's oxides), a polymer-based packaging or board interface such as found in a polyimide-based flex package, lead or other metal alloy solder ball surface, glass and polymers such as polyimides. In more preferred embodiments, the surface or substrate comprises a material common in the packaging and circuit board industries such as silicon, copper, glass, and another polymer.

The surface or substrate contemplated herein may also comprise at least two layers of materials. One layer of material, for example, may include the surface or substrate materials previously described. Other layers of material comprising the surface or substrate may include layers of polymers, monomers, organic compounds, inorganic compounds, organometallic compounds, continuous layers and nanoporous layers.

As used herein, the term "monomer" refers to any chemical compound that is capable of forming a covalent bond with itself or a chemically different compound in a repetitive manner. The repetitive bond formation between monomers may lead to a linear, branched, super-branched, or three-dimensional product. Furthermore, monomers may themselves comprise repetitive building blocks, and when polymerized the polymers formed from such monomers are then termed "blockpolymers". Monomers may belong to various chemical classes of molecules including organic, organometallic or inorganic molecules. The molecular weight of monomers may vary greatly between about 40 Dalton and 20000 Dalton. However, especially when monomers comprise repetitive building blocks, monomers may have even higher molecular weights. Monomers may also include additional groups, such as groups used for crosslinking.

As used herein, the term "crosslinking" refers to a process in which at least two molecules, or two portions of a long molecule, are joined together by a chemical interaction. Such interactions may occur in many different ways including formation of a covalent bond, formation of hydrogen bonds, hydrophobic, hydrophilic, ionic or electrostatic interaction. Furthermore, molecular interaction may also be characterized by an at least temporary physical connection between a molecule and itself or between two or more molecules.

Contemplated polymers may also comprise a wide range of functional or structural moieties, including aromatic systems, and halogenated groups. Furthermore, appropriate polymers may have many configurations, including a homopolymer, and a heteropolymer. Moreover, alternative polymers may have various forms, such as linear, branched, super-branched, or three-dimensional. The molecular weight of contemplated polymers spans a wide range, typically between 400 Dalton and 400000 Dalton or more.

Examples of contemplated inorganic compounds are silicates, aluminates and compounds containing transition metals. Examples of organic compounds include polyarylene ether, polyimides and polyesters. Examples of contemplated organometallic compounds include poly(dimethylsiloxane), poly(vinylsiloxane) and poly(trifluoropropylsiloxane).

The surface or substrate may also comprise a plurality of voids if it is desirable for the material to be nanoporous instead of continuous. Voids are typically spherical, but may alternatively or additionally have any suitable shape, including tubular, lamellar, discoidal, or other shapes. It is also contemplated that voids may have any appropriate diameter. It is further contemplated that at least some of the voids may connect with adjacent voids to create a structure with a significant amount of connected or "open" porosity. The voids preferably have a mean diameter of less than 1 micrometer, and more preferably have a mean diameter of less than 100 nanometers, and still more preferably have a mean diameter of less than 10 nanometers. It is further contemplated that the voids may be uniformly or randomly dispersed within the substrate layer. In a preferred embodiment, the voids are uniformly dispersed within the surface or substrate layer.

A typical surface may also contain fabricated electric components, to which the solution of the polycarbosilane compound is applied. These types of surfaces generally include a wide variety of metal or electrically conducting layers found in conventional semiconductor devices. Typical examples of such a layer/surface include a circuit or wiring layer, an electrode layer, and the like, and the materials of these layers include Al, Cu, Ti, TiN, Ta, TaN, W, TiW, CVD-$SiO_2$, SiON, PSG and the like.

Thus, it is contemplated that the surface may comprise a single layer of conventional substrate material. It is alternatively contemplated that the surface may comprise several layers, along with the conventional substrate material, that function to build up part of the layered material. Layered materials, as contemplated herein, may comprise a) an adhesion promoter material as described herein, b) a dielectric material having a dielectric constant less than about 4.0, wherein the dielectric layer is coupled to the adhesion promoter material; and c) a third layer of material coupled to the adhesion promoter material. The third layer is contemplated to be a surface or substrate material, additional dielectric layers, metal layers, antireflective coating or mask layers, etchstop layers, hardmask layers, or any other suitable layering material. At least one additional layer may be added to the layered material to continue building the component or device.

Contemplated dielectric materials that can be used in the layered material, semiconductor application or electronic application, other than those already described herein, can be organic, inorganic, organometallic or a combination thereof. Preferred additional dielectric material and layers are those found in PCT/US01/32569 filed on Oct. 18, 2001, which is incorporated herein in its entirety. Generally, some contemplated low dielectric materials may comprise at least one cage-based molecule or compound and/or an isomeric mixture of thermosetting monomers, wherein the monomers have a core cage structure and a plurality of arms and the isometric mixture of thermosetting monomers is polymerized. Other contemplated dielectric materials comprise at least one of the following substituent group: adamantane, diamantane, a phenyl, and a sexiphenylene, and especially contemplated arms include a phenylethynylphenyl, a phenylethynylphenylethynylphenyl, a phenylethynylphenylphenyl and a phenylethynylphenylphenyl ether. The cage structure may also comprise a substituted or unsubstituted adamantane, or substituted or unsubstituted diamantane, wherein the adamantane or diamantane may be a apart of the backbone as a pendent group or such that the cage structure has a tetrahedral or polyhedral configuration.

Other contemplated low dielectric constant materials may be incorporated that are formed having a first polymer backbone with an aromatic moiety and a first reactive group, and a second polymer backbone with an aromatic moiety and a second reactive group, wherein the first and second polymer backbone are crosslinked via the first and second reactive groups in a crosslinking reaction preferably without an additional crosslinker, and wherein a cage structure having at least 10 atoms is covalently bound to at least one of the first and second backbones. It is contemplated that the first and second backbone are identical and preferably comprise a phenyl group, more preferably comprise a poly(arylene ether), and most preferably comprise a substituted resorcinol, a substituted tolane, or a substituted phenol as aromatic moiety. In other preferred embodiments, the first and second reactive groups are non-identical and comprise an ethynyl moiety or a tetracyclone moiety, and the crosslinking reaction is a cycloaddition reaction.

Suitable materials that can be used in additional layers comprise any material with properties appropriate for a semiconductor or electronic component, including pure metals, alloys, metal/metal composites, metal ceramic composites, metal polymer composites, cladding material, laminates, waveguides, conductive polymers and monomers, as well as other metal composites.

Laminates are generally considered fiber-reinforced resin dielectric materials. Cladding materials are a subset of laminates that are produced when metals and other materials, such as copper, are incorporated into the laminates. (Harper, Charles A., *Electronic Packaging and Interconnection Handbook,* Second Edition, McGraw-Hill (New York), 1997.)

As used herein, the term "metal" means those elements that are in the d-block and f-block of the Periodic Chart of the Elements, along with those elements that have metal-like properties, such as silicon and germanium. As used herein, the phrase "d-block" means those elements that have electrons filling the 3d, 4d, 5d, and 6d orbitals surrounding the nucleus of the element. As used herein, the phrase "f-block" means those elements that have electrons filling the 4f and 5f orbitals surrounding the nucleus of the element, including the lanthanides and the actinides. Preferred metals include titanium, silicon, cobalt, copper, nickel, zinc, vanadium, aluminum, chromium, platinum, gold, silver, tungsten, molybdenum, cerium, promethium, and thorium. More preferred metals include titanium, silicon, copper, nickel, platinum, gold, silver and tungsten. Most preferred metals include titanium, silicon, copper and nickel. The term "metal" also includes alloys, metal/metal composites, metal ceramic composites, metal polymer composites, as well as other metal composites.

Application of the polycarbosilane compounds onto planar or topographical surfaces or substrates can be carried out by using any conventional apparatus such as a spin coater, roller coater, and the like. Preferably a spin coater is used, because the polycarbosilane compounds used herein has a controlled viscosity in solution suitable for such a coater. Evaporation of the solvent by any suitable means such as simple air drying by exposure to an ambient environment during spin coating or by the application of a vacuum or mild heat (e.g., <50° C.) yields the desired precursor polycarbosilane coating.

The present composition may be used in an all spin-on stacked film as taught by Michael E. Thomas, "Spin-On Stacked Films for Low $k_{eff}$ Dielectrics", *Solid State Technology* (July 2001), incorporated herein in its entirety by reference.

The thickness of the polycarbosilane coating on the surface or substrate can be widely varied depending upon many factors of coating application such as particulars of the polycarbosilane used, other particulars including the concentration of the polycarbosilane solution, the wet coating process (e.g. spin coating), and configurations of the underlying layer, heating or baking temperatures, and the like. Generally, the thickness of the polycarbosilane is preferred to be in the range of about 0.05 to 3 microns ($\mu$m) more preferably, about 0.1 to 2 microns ($\mu$m).

After formation of the polycarbosilane-solvent coating on the surface or substrate, it is subjected to an energy source to chemically react the polycarbosilane compound and to crosslink the polycarbosilane compound to form the adhesion promoter material that comprises a polyorganosilane material. In other embodiments, the coating is subjected to multi-stage heating process at sequentially increasing temperatures ranging from 50° C. up to 450° C. to polymerize the coating to its hardened form without ceramifying the coating and destroying the polycarbosilane structure of the film. The multi-stage baking or heating process comprises: a) heating the coated polycarbosilane compound at a first isothermic plateau temperature not to exceed 100° C. in an atmospheric or nitrogen blanket environment for a time sufficient to remove the solvent and cross-link the polycarbosilane compound/polymer; b) heating the polymer at a second higher isothermic plateau temperature in an atmospheric or nitrogen blanket environment of up to 200° C. for a sufficient period to further cross link the polycarbosilane coating, c) heating the polymer to a third higher isothermic temperature plateau of up to 400° C. under an atmospheric or nitrogen blanket environment for a period sufficient to harden the polycarbosilane coating without causing complete oxidation or ceramification of the organosilicon polymer; and then d) curing the polycarbosilane coating by heating it in a non-oxidizing (inert or non-reactive gaseous) environment at temperatures in excess of 400° C. for a sufficient period to yield a hardened partially oxidized or non oxidized cross-linked polycarbosilane polymer having an electrical dielectric constant of less than 4.0.

Since the baking and curing takes place in an alternative atmospheric or nitrogen environment, a non oxidized, an oxidized, or a partially oxidized cross-linked polycarbosilane results depending on the environmental conditions (oxygen atmosphere or inert gas) in which the baking or curing steps occur. The controlled multistep baking conditions enable the polycarbosilane coating to inter-react and cross link to a polyorganosilane derivative but remain unceramified (oxidation to silicon dioxide) and retentive of the organosilicon character of the polymerized polycarbosilane. The resulting dielectric layer has a dielectric constant k or less than 4.0, preferably less than 3.0, and most preferably less than 2.5. The polyorganosilane physically demonstrates little generation of internal stress, thereby not subject to cracking, and good adhesion to flat or topographical conductive wire patterned surfaces or substrates.

Preferred increasing temperature plateaus in the instant multistep heating or baking process comprises a first step of from about 70° C. to 90° C.; a second step of from 120° C. to 160° C.; and a third step of from about 220° C. to 300° C. As will become apparent in the examples, the critical step of the present heating (or baking) and curing process of the present invention is that heating step above 200° C. and less than 400° C. It has been found that heating the polycarbosilane of Formula I at elevated isothermic temperatures plateaus of up to 200° C. and then finally heating the processed polycarbosilane (before curing) at an isothermic temperature plateau of from 240° C. to 260° C. generates a polycarbosilane having a low dielectric constant of less than 3.0.

While not to be construed as limiting it is speculated that the processing under atmospheric (oxygenated) conditions results in the following partially oxidized cross-linked structure:

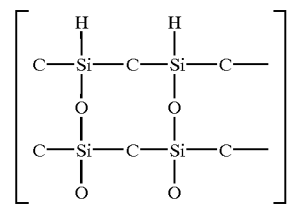

The structure speculated when the instant process is completely carried out under non-oxygenated conditions is as follows:

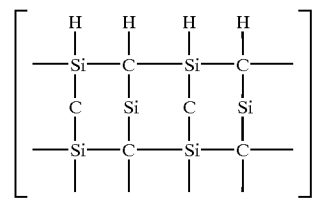

During the process formation of each of these structures, the silicon-hydrogen bonds in the precursor polycarbosilane polymers causes formation of strong adhesive bonding with the coated surface, material/layer or substrate.

Curing can be carried out at any temperature and time suitable for completion of the crosslinking and hardening of the polycarbosilane in an inert environment to a partially oxidized cross-linked dielectric layer. However the curing temperature should not be below 350° C. because a lower temperature is insufficient to complete the crosslinking of the polycarbosilane polymer. Generally, it is preferred that curing is carried out at temperatures of from 400° C. to about 450° C. Similarly, the curing time can be varied under consideration of the curing temperature and other conditions, and generally, the preferred range of curing time is from about 30 minutes to about 60 minutes.

Curing can be carried out in a conventional curing chamber such as an electric oven, hot plate, and the like. Curing is carried out in a non-oxidizing atmosphere (nitrogen, helium or the like) in the curing chamber. The inert atmosphere generally used in the following Examples is a nitrogen blanket. Other non oxidizing or reducing atmospheres may be used in the practice of the present invention, if they are effective to conduct curing of the polycarbosilane to achieve the low k dielectric film herein.

As mentioned earlier, the low dielectric coating materials and films contemplated herein can be used as a replacement for silicon dioxide. These low dielectric coating materials and films are readily useful as film forming materials in the manufacture of semiconductor devices, semiconductor components, electronic components and layered materials.

The term "semiconductor device" used herein is intended to mean a variety of devices having a substrate consisting of semiconductor material, such as silicon, having patterned thereon semiconductor integrated circuits (ICs), large scale integration circuits (LSIs), very large scale integration circuits (BLSIs) ultra large scale integration circuits (ULSIs) and the like as well as any other electronic devices employing semiconductor material.

Electronic components, as contemplated herein, are generally thought to comprise any layered component that can be utilized in an electronic-based product. Contemplated electronic components comprise circuit boards, chip packaging, separator sheets, dielectric components of circuit boards, printed-wiring boards, and other components of circuit boards, such as capacitors, inductors, and resistors.

Electronic-based products can be "finished" in the sense that they are ready to be used in industry or by other consumers. Examples of finished consumer products are a television, a computer, a cell phone, a pager, a palm-type organizer, a portable radio, a car stereo, and a remote control. Also contemplated are "intermediate" products such as circuit boards, chip packaging, and keyboards that are potentially utilized in finished products.

Electronic products may also comprise a prototype component, at any stage of development from conceptual model to final scale-up mock-up. A prototype may or may not contain all of the actual components intended in a finished product, and a prototype may have some components that are constructed out of composite material in order to negate their initial effects on other components while being initially tested.

In FIG. 1, a polycarbosilane dielectric interlayer 30 is shown coated on semiconductor substrate 10. Note that the instant dielectric layer 30 has a flat planarized surface not reproducing the stepped profile of the patterned metal layer which has two types of patterned steps, i.e., a relatively wide step 20a such as an electrode and a relatively narrow step 20b such as wiring. After formation of the metal wire pattern layer 20, the instant polycarbosilane layer is spin coated over the metal layer 20 using the polycarbosilane of Formula I above. Thereafter the layer is subjected to the multi-step heating and curing process herein described herein resulting in the flat dielectric interlayer 30 surface demonstrating the global planarization accomplished by the nature of the low k dielectric polycarbosilane film achieve in the practice of present process invention. Naturally, the instant polycarbosilane and process can be used to sequentially coat multiple patterned metal layers.

By the above methods a silicon-containing planarizing coating is produced on the substrate. The coating smoothes the irregular surfaces of various substrates and has excellent adhesion. In addition, this coating can be quite thick (e.g. >0.5 microns). This polycarbosilane interlayer coating may also be covered by other coatings such as further $SiO_2$ coatings, $SiO_2$/modifying ceramic oxide layers, silicon containing coatings, silicon carbon containing coatings, silicon nitrogen containing coatings, silicon nitrogen carbon containing coatings and/or diamond like carbon coatings. Such multilayer coatings are taught in U.S. Pat. No. 4,973,526, which is incorporated herein by reference. And, of course, the polycarbosilanes prepared in the instant process can be formed as interlined deposition coatings or films between lined conductor elements on an electronic or fabricated semiconductor substrate.

The following non-limiting Examples are provided so that one skilled in the art may more readily understand the invention.

EXAMPLE 1

Two grams of allylhydridopolycarbosilane, $[[Si(CH_2CHCH)HCH_2]_{0.1}[SiH_2CH_2]_{0.9}]_n$, (AHPCS) purchased from Starfire Systems, Inc. was dissolved in 4 grams of anhydrous dibutyl ether. The solution was then filtered through a 0.2 micron filter. About 2 mL of this solution was dispensed onto the surface of a 4" wafer and then the wafer was spun at 2000 rpm for 30 seconds. The coated wafer was heated in sequential elevated temperatures of 80C., 150C., and 250C. for three minutes for each step under atmosphere (air) conditions. Then the film was cured in a furnace at 400C. for 30 minutes under nitrogen environment.

Figure 2:
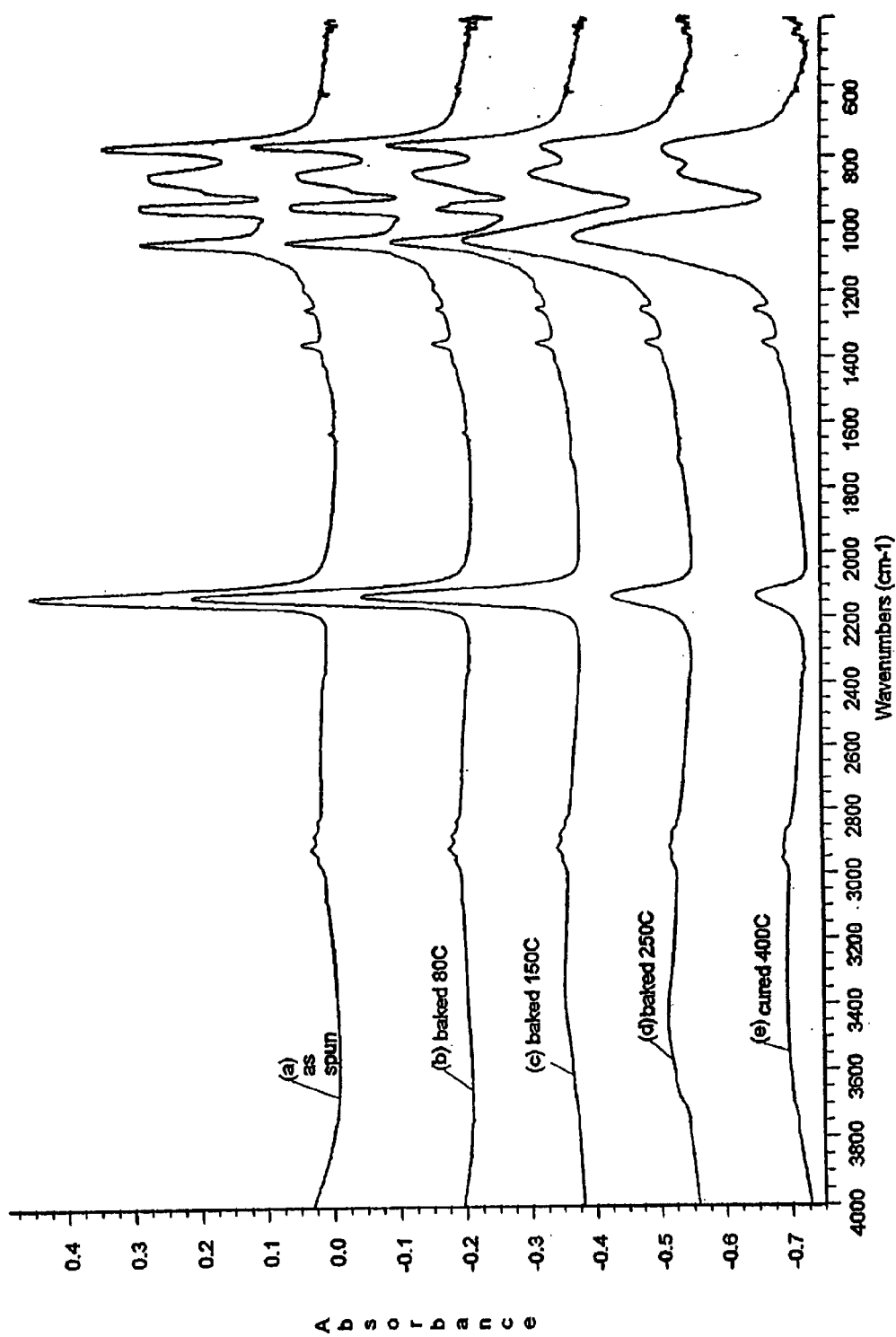
FIG. 2 is an infrared spectra of the polycarbosilane film prepared in Example 1.

FIG. 2 represents the infrared spectra of the films after each process step. (a) as spun; (b) baked at 80° C.; (c) baked at 150° C.; (d) baked at 250° C.; and (e) cured at 400° C. IR spectra were obtained on the film as-spun and after each process step. The assignment of the infrared absorption of this material is shown in Table 1. The structural change of the spun film during the sequential heating and cure can be monitored by following the infrared spectra of the film after each process step (shown in FIG. 2 and Table 2). One obvious change during heating of the film is the decreasing intensity of Si—H absorption at about 2130 $cm^{-1}$. The integration of the Si—H peak area (shown below in FIG. 2) indicated the reaction of Si—H during the process. Concurrent with the decrease of Si—H, was an increase in the absorption spectra at about 1050 $cm^{-1}$, indicating formation of Si—O bonding. The presence of the absorption at 1357, 1048, and 765 $cm^{-1}$ indicated the preservation of Si—C structure in the process. The information obtained from infrared spectra suggests that the film after curing at 400° C. has retained the bonding linkages of Si—C, Si—H, Si—O, and C—H. The refractive index was measured on a Woolam ellipsometer. The film after cure at 400° C. showed film thickness of 6242 A and refractive index of 1.46 at 633 nm. The dielectric constant was measured by the standard CV curve technique at 1 MHz, using MOS capacitor structure. The dielectric constant of the prepared film was 2.5.

TABLE 1

Infrared Absorption Assignment for AHPCS

| Wave Number (cm$^{-1}$) | Peak Molecular |
|---|---|
| 2958 | CH3 asymmetric stretching |
| 2923 | CH2 asymmetric stretching |
| 2883 | CH3 symmetric stretching |
| 2853 | CH2 symmetric stretching |
| 2131 | Si—H stretching |
| 1357 | Si—CH2—Si deformation |
| 1254 | Si—CH3 symmetric deformation |
| 1048 | Si—C—Si wag |
| 936 | Si—H2 scissors mode |
| 846 | SiH2 wag |
| 765 | Si—C—Si asymmetric stretching |

TABLE 2

Peak Area In Infrared Spectra After Each Process Step

| | Si—H peak area (2300–2000 cm-1) | C—H peak area (3050–2700 cm-1) |
|---|---|---|
| As-spun | 23.97 | 1.953 |
| 80 | 22.97 | 1.851 |
| 150 | 19.77 | 1.924 |
| 250 | 9.13 | 1.813 |
| 400 | 5.92 | 1.433 |

EXAMPLE 2

Two grams of allylhydridopolycarbosilane (AHPCS) purchased from Starfire Systems, Inc. was dissolved in 4 grams of anhydrous dibutyl ether. The solution was then filtered through a 0.2 micron filter. About 2 mL of this solution was dispensed onto the surface of 4" wafer and then the wafer was spun at 2000 rpm for 30 seconds. The coated wafer was heated at sequentially elevated temperatures of 80C., 150C., and 220C. for three minutes each under atmosphere (air) conditions. Then the film was cured in a furnace at 400° C. for 60 minutes under a nitrogen blanket environment.

Figure 3:
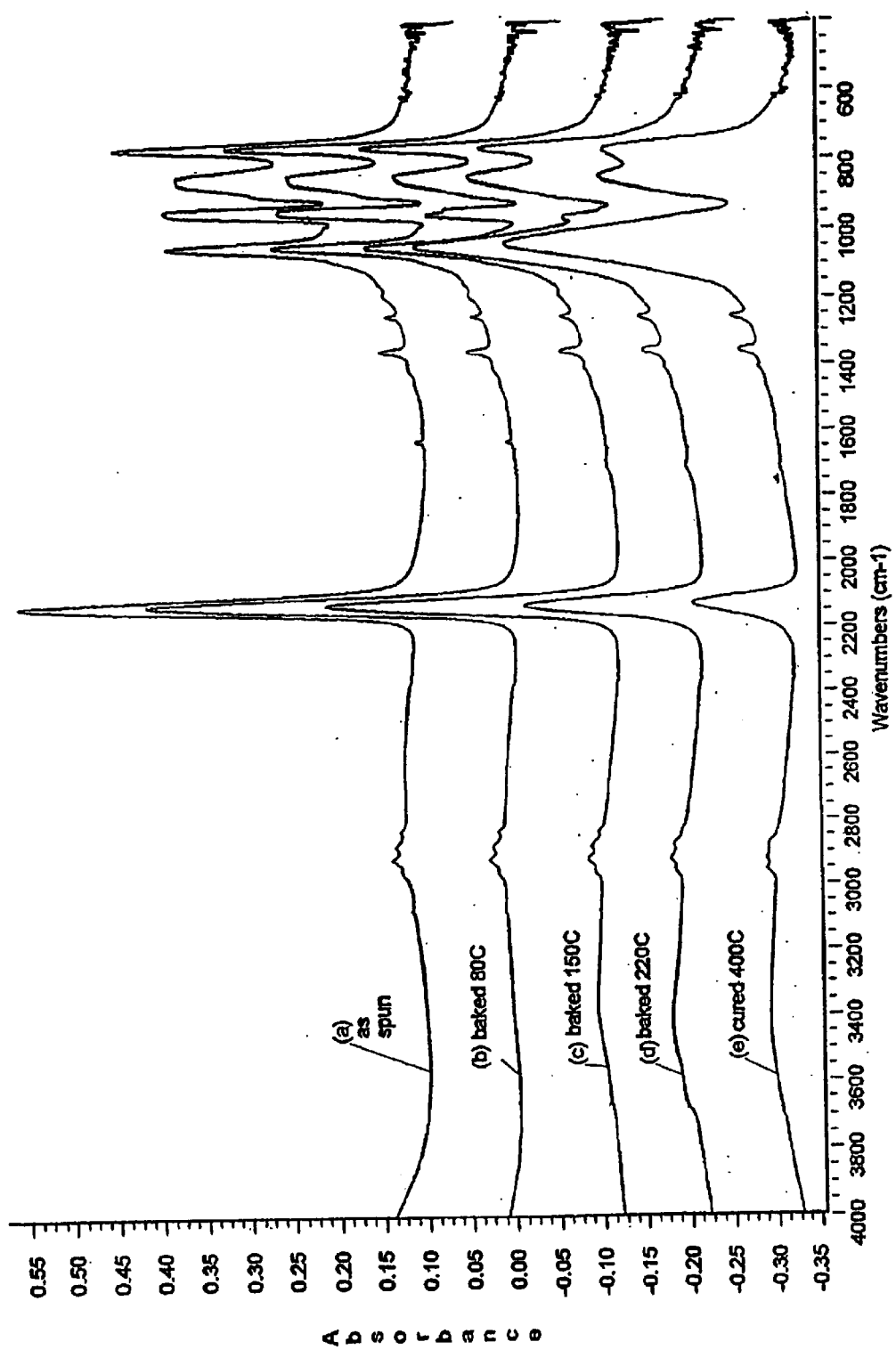
FIG. 3 is an infrared spectra of the polycarbosilane film prepared in Example 2.

FIG. 3 represents the infrared spectra of the films after each process step. (a) as spun; (b) baked at 80° C.; (c) baked at 150° C.; (d) baked at 250° C.; and (e) cured at 400° C. IR spectra were obtained from the film as-spun and after each process step. The assignment of the infrared absorption of this material is shown in Table 1. The structural change of the spun film during the sequential heating and cure can be monitored by following the infrared spectra of the film after each process step as indicated in Table 3 and FIG. 3. One obvious change during heating of the film is the decreasing intensity of Si—H absorption at about 2130 cm$^{-1}$. The integration of the Si—H peak area (shown below in FIG. 3) indicated the reaction of the Si—H linkage during the process. Concurrent with the decrease of Si—H linkages, there was an increase in the absorption at about 1050 cm$^{-1}$, indicating formation of Si—O bonding. The presence of the absorption at 1357, 1048, and 765 cm$^{-1}$ demonstrates the preservation and maintenance of the Si—C structure in the backbone of the polymer during the process. The information obtained from infrared spectra suggests that the film after cure at 400° C. has retained the bonding of Si—C, Si—H, Si—O, and C—H linkages. The refractive index was measured on a Woolam ellipsometer. The film after cure at 400° C. showed film thickness of 6425 A and refractive index of 1.468 at 633 nm. The dielectric constant was measured by the standard CV curve technique, using MOS capacitor structure. The dielectric constant of the prepared films was 2.6.

TABLE 3

Peak Area In Infrared Spectra After Each Process Step

| | Si—H peak area (2300–2000 cm-1) | C—H peak area (3050–2700 cm-1) |
|---|---|---|
| As-spun | 24.02 | 2.08 |
| 80 | 22.96 | 2 |
| 150 | 19.64 | 1.908 |
| 250 | 13.62 | 1.784 |
| 400 | 8.47 | 1.527 |

EXAMPLE 3

Two grams of hydridopolycarbosilane (HPCS), $[SiH_2CH_2]_n$, purchased from Starfire Systems, Inc. was dissolved in 4 grams of anhydrous dibutyl ether. The solution was then filtered through a 0.2 micron filter. About 2 mL of this solution was dispensed onto the surface of a 4" wafer and then the wafer was spun at 2500 rpm for 30 seconds. As in the earlier Examples, the coated wafer was heated sequentially at 80C., 150C., and 220C. for three minutes, each step carried out under atmosphere (air) conditions. Then the film was cured in a furnace at 400° C. for 60 minutes under a Nitrogen blanket environment.

Figure 4:
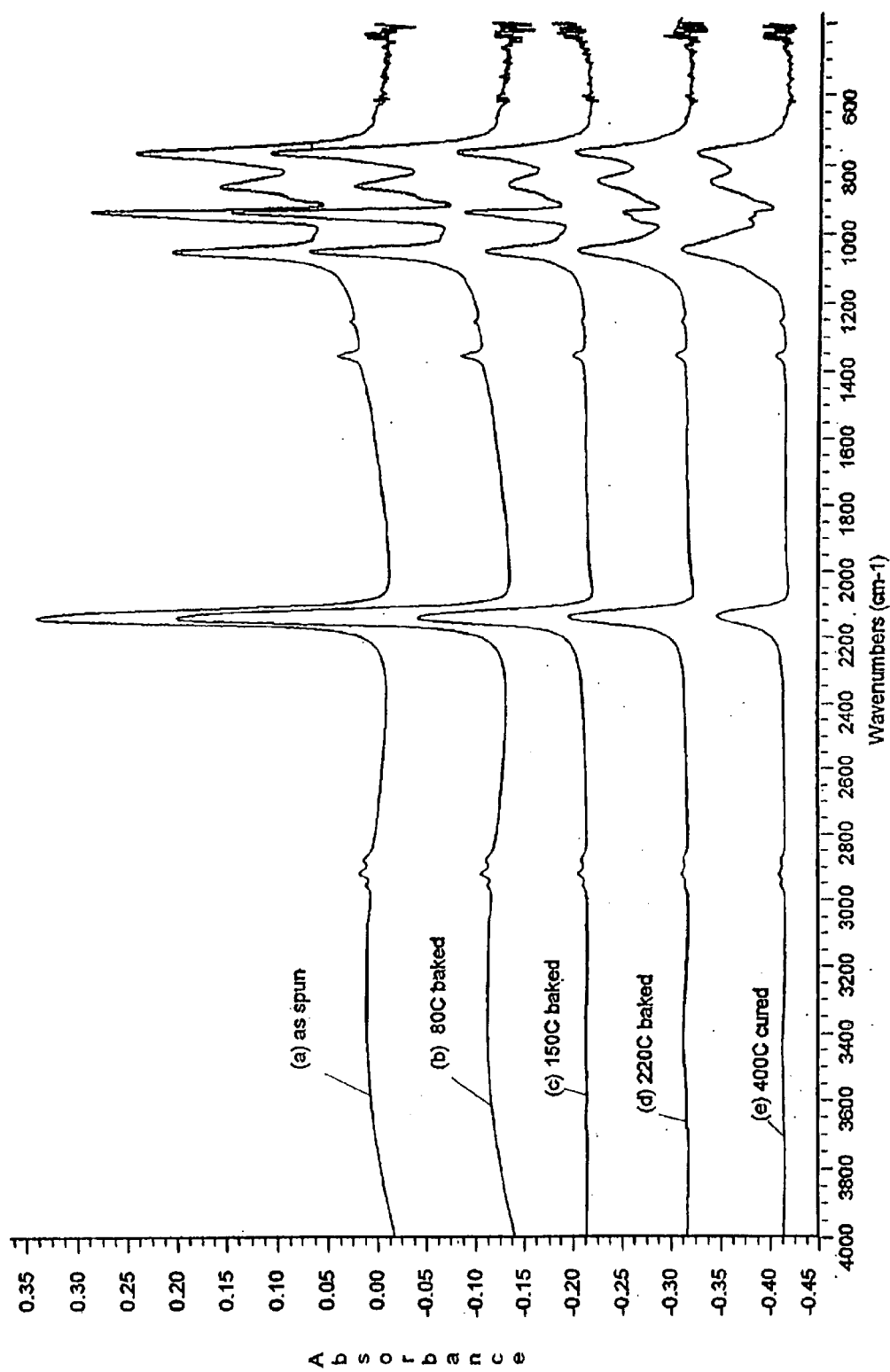
FIG. 4 is an infrared spectra of the polycarbosilane film prepared in Example 3.

FIG. 4 represents the infrared spectra of the films after each process step. (a) as spun; (b) baked at 80° C.; (c) baked at 150° C.; (d) baked at 250° C.; and (e) cured at 400° C. IR spectra were obtained for the films as-spun and after each process step. The assignment of the infrared absorption of this material is shown in Table 4. The structural change of the spun film during the sequential heating and cure can be monitored by following the FT-IR of the film after each process step. One obvious change during the sequential elevated heating of the film is the decrease intensity of Si—H absorption at about 2143 cm$^{-1}$. As demonstrated below in FIG. 4 and Table 5, the integration of the Si—H peak area indicated the reaction of Si—H during the process. Concurrent with the decrease of Si—H, there was an increase in the absorption at about 1050 cm$^{-1}$, indicating formation of Si—O bonding. The presence of the absorption at 1358, 1048, and 763 cm$^{-1}$ indicated the preservation of Si—C structure in the process. The information obtained from infrared spectra suggests that the film, after curing at 400° C., has the bonding linkages of Si—C, Si—H, Si—O, and C—H. The refractive index was measured on a Woolam ellipsometer. The film after cure at 400° C. demonstrated a film thickness of 3752 A and refractive index of 1.536 at 633 nm.

TABLE 4

Infrared Absorption Assignment for AHPCS

| Wave Number (cm$^{-1}$) | Peak Molecular |
|---|---|
| 2958 | CH3 asymmetric stretching |
| 2923 | CH2 asymmetric stretching |
| 2883 | CH3 symmetric stretching |
| 2853 | CH2 symmetric stretching |
| 2143 | Si—H stretching |
| 1358 | Si—CH2—Si deformation |

TABLE 4-continued

Infrared Absorption Assignment for AHPCS

| Wave Number (cm$^{-1}$) | Peak Molecular |
|---|---|
| 1254 | Si—CH3 symmetric deformation |
| 1048 | Si—C—Si wag |
| 932 | Si—H2 scissors mode |
| 861 | SiH2 wag |
| 763 | Si—C—Si asymmetric stretching |

TABLE 5

Peak Area In Infrared Spectra After Each Process Step

| | Si—H peak area (2300–2000 cm-1) | C—H peak area (3050–2700 cm-1) |
|---|---|---|
| As-spun | 19.81 | 0.968 |
| 80 | 19.09 | 0.931 |
| 150 | 9.81 | 0.503 |
| 220 | 7.21 | 0.397 |
| 400 | 4.62 | 0.387 |

EXAMPLE 4

Two grams of allylhydridopolycarbosilane (AHPCS) purchased from Starfire Systems, Inc. was dissolved in 4 grams of anhydrous dibutyl ether. The solution was then filtered through a 0.2 micron filter. About 2 mL of this solution was dispensed onto the surface of a 4" wafer and then the wafer was spun at 2000 rpm for 30 seconds. The coated wafer was heated sequentially at 80C., 150C., and 250C. for three minutes each under atmospheric (air) conditions. Then the film was cured in a furnace at 400° C. for 30 minutes under a nitrogen blanket environment.

The refractive index was measured on a Woolam ellipsometer. The film after cure at 400° C. showed film thickness of 5466 A and refractive index of 1.479 at 633 nm. The dielectric constant was measured by the standard CV curve technique, using MOS capacitor structure. The dielectric constant of the prepared films was 2.4. The peak area for cured films: Si—H: 7.09, C—H 1.53.

EXAMPLE 5

Two grams of allylhydridopolycarbosilane (AHPCS) purchased from Starfire Systems, Inc. was dissolved in 4 grams of anhydrous dibutyl ether. The solution was then filtered through a 0.2 micron filter. About 2 mL of this solution was dispensed onto the surface of a 4" wafer and then the wafer was spun at 2000 rpm for 30 seconds. The coated wafer was heated sequentially at 80C., 150C., and 300C. for three minutes each under atmospheric (air) conditions. Then the film was cured in a furnace at 400° C. for 30 minutes under nitrogen environment.

The refractive index was measured on a Woolam ellipsometer. The film after cure at 400C. showed film thickness of 5549 A and refractive index of 1.469 at 633 nm. The dielectric constant was measured by the standard CV curve technique, using MOS capacitor structure. The dielectric constant of the prepared films was 3.5. The peak area for cured films: Si—H: 2.72, C—H 1.45.

EXAMPLE 6

Figure 5:
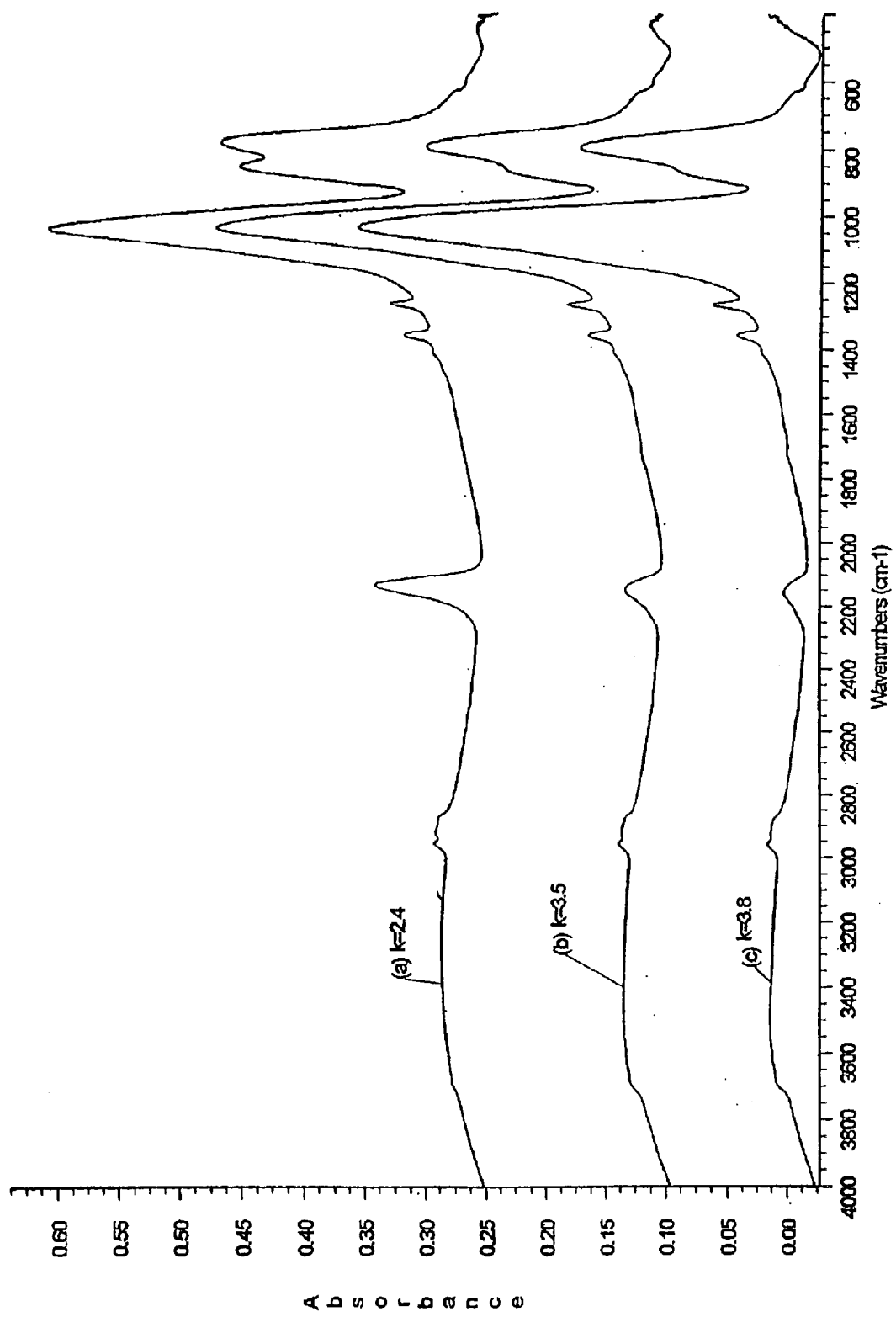
FIG. 5 is an infrared spectra of the polycarbosilane film prepared in Example 6.

Two grams of allylhydridopolycarbosilane (AHPCS) purchased from Starfire Systems, Inc. was dissolved in 4 grams of anhydrous dibutyl ether. The solution was then filtered through a 0.2 micron filter. About 2 mL of this solution was dispensed onto the surface of 4" wafer and then the wafer was spun at 2000 rpm for 30 seconds. The coated wafer was heated sequentially at 80C., 150C., and 320C. for three minutes each under atmospheric (air) conditions. Then the film was cured in a furnace at 400° C. for 30 minutes under nitrogen environment. FIG. 5 represents the infrared spectra of cured AHPCS films baked at different temperatures. (a) Baked at 250° C.; (b) Baked at 300° C.; and (c) Baked at 320° C.

The refractive index was measured on a Woolam ellipsometer. The film after cure at 400° C. showed film thickness of 5777 A and refractive index of 1.4576 at 633 nm. The dielectric constant was measured by the standard CV curve technique, using MOS capacitor structure. The dielectric constant of the prepared films was 3.8. The peak area for cured films: Si—H: 1.88, C—H 1.25.

A Comparison of Examples 4, 5, and 6 with the earlier examples demonstrates a direct correlation of the heating process to the ultimate polycarbosilane generated polyorganosilicon product generated in terms of the extent of oxidation (Si—H and Si—C bond retention), and dielectric constant of the resulting films. This correlation can be observed from the following Table 6 and the IR spectra of FIG. 5. As the final bake temperature (in air) is raised, the Si—H peak area decreases and the dielectric constant (k) of the resulting films increased. This dramatically demonstrates that by controlling and changing the heating process temperature or atmospheric conditions, the structure and composition of the processed film can be predictably tuned to produce a film with certain desired properties. The rise of the dielectric constant (k) is directly attributable to the decrease of Si—H and Si—C content and the increase of Si—O in the film. As the Si—O content increases in the film, the film can be expected to behave more like $SiO_2$ film and the dielectric constant k will also be closer to that of $SiO_2$ (k of $SiO_2$ is 3.9).

TABLE 6

The comparison of dielectric constant (k), Si—H peak area, and C—H area

| Final Bake Temperature (C.) | k | Si—H peak area | C—H peak area |
|---|---|---|---|
| 250 | 2.4 | 7.09 | 1.53 |
| 300 | 3.5 | 2.72 | 1.45 |
| 320 | 3.8 | 1.88 | 1.25 |

As indicated above, among the instant multi-heating steps at sequentially elevated temperatures, that heating step taking place at temperature of from 200° C. to 300° C. is critical to achievement of low k dielectric film coatings. The preferred range for this treatment step is from about 240° C. to 260° C. to achieve optimal dielectric film coatings having a dielectric constant k of less than 3. An isothermal heat treatment plateau of 250° C. will yield a low k polycarbosilane film of about 2.5.

The Examples all clearly demonstrate that the present multistep heat treatment of polycarbosilanes disclosed herein generates a low k dielectric polyorganosilicon film coating of unexpectedly unique structural character.

Thus, specific embodiments and applications of polyorganosilicon materials have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

We claim:

1. An adhesion promoter material prepared by a process, comprising:

provding a polycarbosilane compound having the general formula:

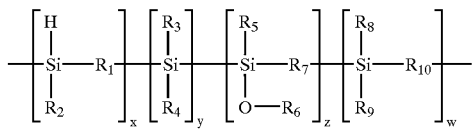

in which:

$R_1$, $R_7$ and $R_{10}$ each independently represents a substituted or unsubstituted alkylene, cycloalkylene, or arylene group;

$R_2$, $R_3$, $R_4$, $R_5$, $R_8$ and $R_9$ each independently represents a hydrogen atom or a first organic group;

$R_6$ represents an organosilicon, a silanyl, a siloxyl, or a second organic group; and x, y, z and w satisfying the conditions of [4<x+y+z+w<100,000], wherein y and w can collectively or independently be zero and wherein z>zero;

coating a surface with the polycarbosilane compound to produce a polycarbosilane-coated surface; and subjecting the polycarbosilane-coated surface to an energy source to chemically react the polycarbosilane compound and to crosslink the polycarbosilane compound to form the adhesion promoter material that comprises a polyorganosilicon material, wherein the adhesion promoter material has a dielectric constant of less than 4.0.

2. A layered material comprising:
the adhesion promoter material of claim 1;
a dielectric material having a dielectric constant less than about 4.0, wherein the dielectric material is coupled to the adhesion promoter material; and
a third layer of material coupled to the adhesion promoter material.

3. The layered material of claim 2, wherein the dielectric constant is less than about 3.0.

4. The layered material of claim 3, wherein the dielectric constant is less than about 2.5.

5. The layered material of claim 2, wherein the dielectric material comprises an organic-based compound.

6. The layered material of claim 5, wherein the organic-based compound comprises a thermosetting monomer.

7. The layered material of claim 6, wherein the thermosetting monomer comprises a cage-based molecule.

8. The layered material of claim 7, wherein the cage-based molecule comprises adamantane.

9. The layered material of claim 2, wherein the dielectric material comprises a porous structure.

10. The layered material of claim 2, wherein the adhesion promoter material has a dielectric constant of less than about 3.0.

11. The layered material of claim 2, wherein the adhesion promoter material and the dielectric material comprise a same compound.

12. The layered material of claim 11, wherein the same compound is polyorganosilicon compound.

13. The layered material of claim 2, wherein the layered material comprises at least one additional layer of material.

14. A semiconductor component comprising the adhesion promoter material of claim 1.

15. A film comprising the adhesion promoter material of claim 1.

16. An electronic component comprising the adhesion promoter material of claim 1.

17. An electronic component comprising the layered material of claim 2.

18. A semiconductor component comprising the layered material of claim 2.

* * * * *

UNITED STATES PATENT AND TRADEMARK OFFICE
CERTIFICATE OF CORRECTION

| | |
|---|---|
| PATENT NO. | : 6,841,256 B2 |
| DATED | : January 11, 2005 |
| INVENTOR(S) | : Paul Apen and Hui-Jung Wu |

It is certified that error appears in the above-identified patent and that said Letters Patent is hereby corrected as shown below:

<u>Column 1,</u>
Line 8, replace "b09/327,356" with -- 09/327,356 --

Signed and Sealed this

Tenth Day of May, 2005

JON W. DUDAS
*Director of the United States Patent and Trademark Office*